United States Patent
Kuramoto et al.

(10) Patent No.: US 10,892,601 B2
(45) Date of Patent: Jan. 12, 2021

(54) VERTICAL CAVITY LIGHT-EMITTING ELEMENT

(71) Applicants: STANLEY ELECTRIC CO., LTD., Tokyo (JP); MEIJO UNIVERSITY, Nagoya (JP)

(72) Inventors: Masaru Kuramoto, Tokyo (JP); Seiichiro Kobayashi, Tokyo (JP); Tetsuya Takeuchi, Nagoya (JP)

(73) Assignees: STANLEY ELECTRIC CO., LTD., Tokyo (JP); MEIJO UNIVERSITY, Nagoya (JP)

( * ) Notice: Subject to any disclaimer, the term of this patent is extended or adjusted under 35 U.S.C. 154(b) by 0 days.

(21) Appl. No.: 16/419,873

(22) Filed: May 22, 2019

(65) Prior Publication Data

US 2019/0363515 A1    Nov. 28, 2019

(30) Foreign Application Priority Data

May 24, 2018  (JP) ................................. 2018-099677
Dec. 20, 2018  (JP) ................................. 2018-238075

(51) Int. Cl.
*H01S 5/183* (2006.01)
*H01S 5/30* (2006.01)
*H01S 5/343* (2006.01)

(52) U.S. Cl.
CPC ...... *H01S 5/18361* (2013.01); *H01S 5/18333* (2013.01); *H01S 5/18341* (2013.01);
(Continued)

(58) Field of Classification Search
CPC ............... H01S 5/18358; H01S 5/1833; H01S 5/18333; H01S 5/18322; H01S 5/18311;
(Continued)

(56) References Cited

U.S. PATENT DOCUMENTS

| 6,618,414 B1* | 9/2003 | Wasserbauer ....... H01S 5/18358 372/45.01 |
| 2002/0150135 A1* | 10/2002 | Naone .................. G02B 6/4225 372/45.011 |

(Continued)

FOREIGN PATENT DOCUMENTS

JP          5707742 B2     4/2015

*Primary Examiner* — Joshua King
(74) *Attorney, Agent, or Firm* — Holtz, Holtz & Volek PC

(57) ABSTRACT

A vertical cavity light-emitting element comprises a substrate, a first multilayer reflector formed on the substrate, a semiconductor structure layer formed on the first multilayer reflector and including a light emitting layer, a second multilayer reflector formed on the semiconductor structure layer and constituting a resonator together with the first multilayer reflector, and a light guide layer configured to form a light guide structure including a center region extending in a direction perpendicular to the upper surface of said substrate between the first and second multilayer reflectors and including a light emission center of the light-emitting layer and a peripheral region provided around the center region and having a smaller optical distance between the first and second multilayer reflectors than that in the center region. The second multilayer reflector has a flatness property over the center region and the peripheral region.

6 Claims, 9 Drawing Sheets

(52) U.S. Cl.
CPC ......... *H01S 5/1833* (2013.01); *H01S 5/18305* (2013.01); *H01S 5/18358* (2013.01); *H01S 5/3095* (2013.01); *H01S 5/34333* (2013.01); *H01S 2301/166* (2013.01)

(58) Field of Classification Search
CPC ........... H01S 5/18341; H01S 2301/166; H01S 5/183–18397; H01S 5/18308–18338; H01S 5/18377; H01S 5/1838; H01S 5/18361; H01S 5/18369
See application file for complete search history.

(56) References Cited

U.S. PATENT DOCUMENTS

| | | | | |
|---|---|---|---|---|
| 2003/0185267 A1* | 10/2003 | Hwang | ............... | H01S 5/18358 372/96 |
| 2004/0058467 A1* | 3/2004 | Chirovsky | .......... | H01S 5/18341 438/32 |
| 2006/0249738 A1* | 11/2006 | Ortsiefer | ............ | H01S 5/18308 257/80 |
| 2007/0120133 A1* | 5/2007 | Koda | ............. | H01L 31/022408 257/80 |
| 2008/0279229 A1* | 11/2008 | Suzuki | ............... | H01S 5/18327 372/19 |
| 2008/0298416 A1* | 12/2008 | Chirovsky | .......... | H01S 5/18369 372/50.11 |
| 2008/0304532 A1* | 12/2008 | Uchida | ............... | H01S 5/18327 372/50.124 |
| 2009/0001386 A1* | 1/2009 | Koda | .................... | H01S 5/0262 257/79 |
| 2009/0041075 A1* | 2/2009 | Hashimoto | ......... | H01S 5/18308 372/45.01 |
| 2009/0116526 A1* | 5/2009 | Hashimoto | ......... | H01S 5/18369 372/46.01 |
| 2010/0046565 A1* | 2/2010 | Masui | ................ | H01S 5/18336 372/45.01 |
| 2011/0027924 A1* | 2/2011 | Ikuta | ................... | H01S 5/18333 438/29 |
| 2011/0064109 A1* | 3/2011 | Masui | ................ | H01S 5/18311 372/46.013 |
| 2011/0103420 A1* | 5/2011 | Koda | .................... | B82Y 20/00 372/45.01 |
| 2012/0076163 A1* | 3/2012 | Takeuchi | ........... | H01S 5/18311 372/45.01 |
| 2012/0307855 A1* | 12/2012 | Chitica | ............... | H01S 5/18327 372/45.01 |
| 2017/0025820 A1* | 1/2017 | Suzuki | ................... | H01S 5/0421 |
| 2018/0019302 A1* | 1/2018 | Deppe | .................... | H01L 33/145 |
| 2018/0019572 A1* | 1/2018 | Deppe | .................... | H01S 5/2054 |
| 2018/0366906 A1* | 12/2018 | Hamaguchi | ........... | H01S 5/0421 |

* cited by examiner

VERTICAL CAVITY LIGHT-EMITTING ELEMENT

BACKGROUND OF THE INVENTION

1. Field of the Invention

The present invention relates to a vertical cavity light-emitting element such as a vertical cavity surface emitting laser.

2. Description of the Related Art

A vertical cavity surface emitting laser (hereinafter simply referred to as a surface emitting laser) is a semiconductor laser having a reflector formed from a multilayer film stacked on a substrate and emitting light along a direction perpendicular to the surface of the substrate. For example, Japanese Patent No. 57077421 discloses a surface emitting laser using a nitride semiconductor.

SUMMARY OF THE INVENTION

For example, in a vertical cavity light-emitting element such as a surface emitting laser, it is preferable that the threshold voltage be low and the output be high. Further, in the surface emitting laser, it is preferable that the output be stable, for example, the slope efficiency be high.

It is an object of the present invention to provide a vertical cavity light-emitting element having a low threshold and a high output.

the present invention is a vertical cavity light-emitting element comprising:

a substrate;

a first multilayer reflector formed on said substrate;

a semiconductor structure layer formed on said first multilayer reflector and including a light emitting layer;

a second multilayer reflector formed on said semiconductor structure layer and constituting a resonator together with said first multilayer reflector; and a light guide layer configured to form a light guide structure including a center region extending in a direction perpendicular to the upper surface of said substrate between said first and second multilayer reflectors and including a light emission center of said light-emitting layer, and a peripheral region provided around said center region and having a smaller optical distance between said first and second multilayer reflectors than that in said center region, wherein said second multilayer reflector has a flatness property over said center region and said peripheral region.

DETAILED DESCRIPTION OF THE INVENTION

Hereinafter, embodiments of the present invention will be described in detail. In the following embodiments, cases where the present invention is implemented as a surface emitting laser (semiconductor laser) will be described. However, the present invention is not limited to surface emitting lasers, and may be applied to various vertical cavity light-emitting elements such as vertical cavity light-emitting diodes.

First Embodiment

Figure 1A:
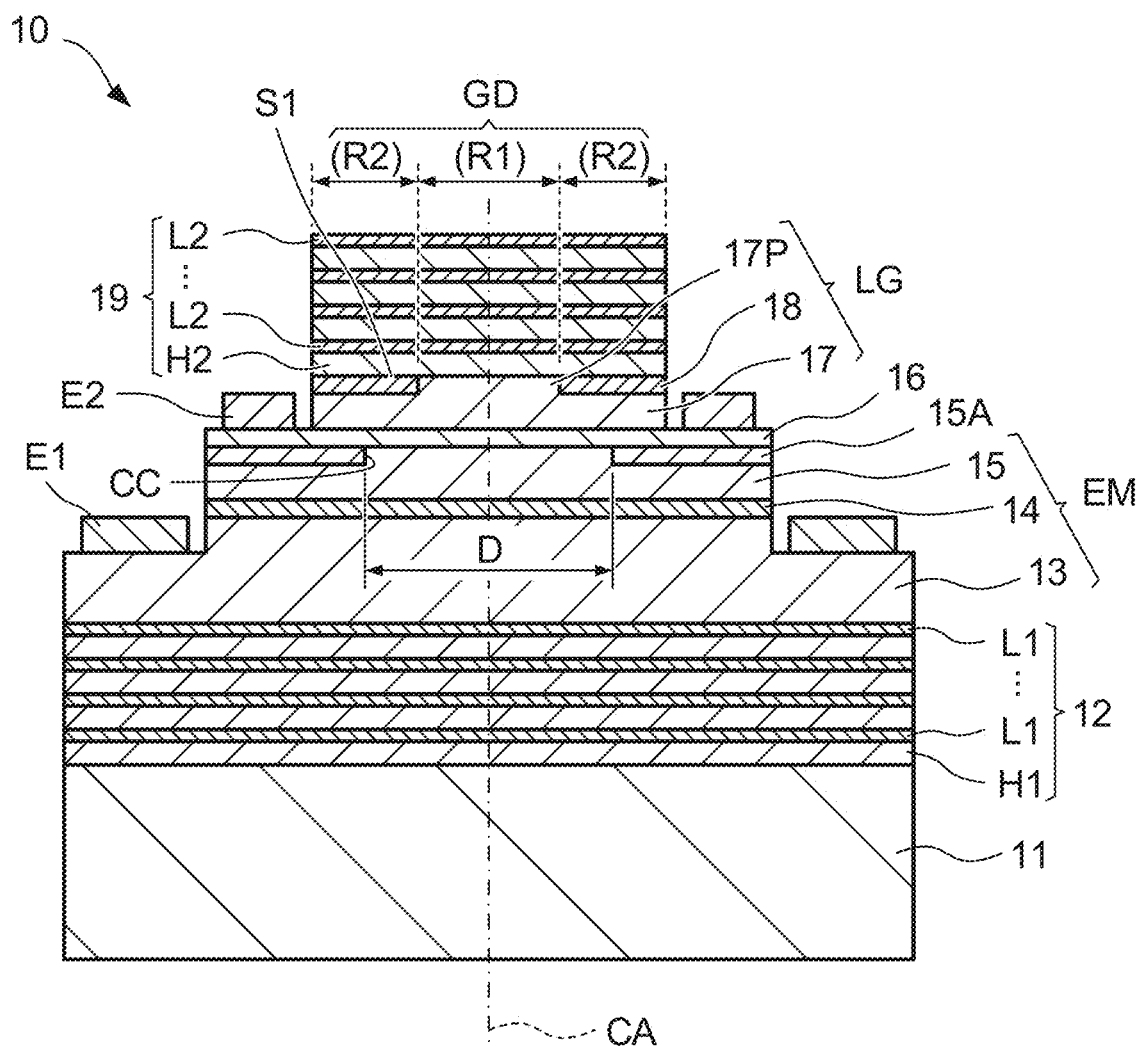
FIG. 1A is a cross-sectional view of a surface emitting laser according to a first embodiment.
Figure 1B:
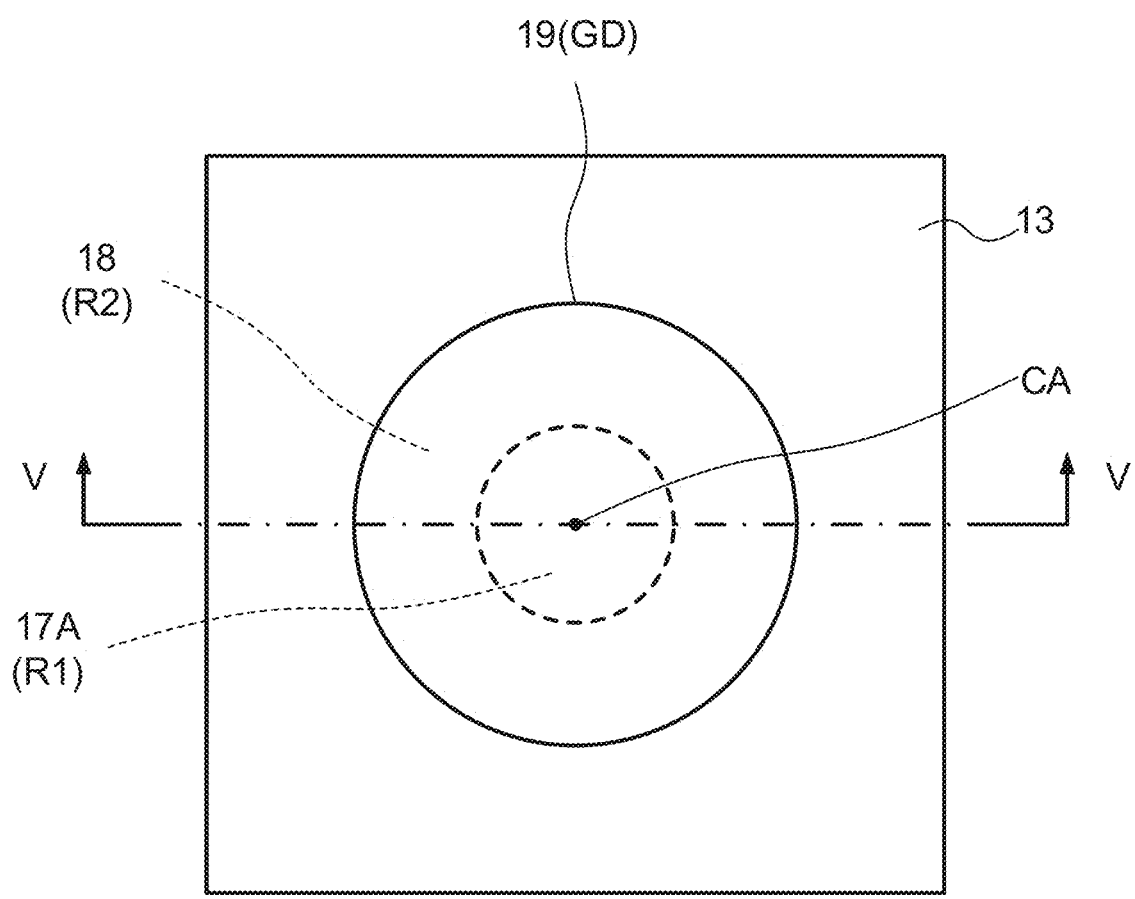
FIG. 1B is a schematic top view of the surface emitting laser according to the first embodiment.

FIG. 1A is a cross-sectional view of a vertical cavity surface emitting laser (VCSEL: Vertical Cavity Surface Emitting Laser, hereinafter referred to as a surface emitting laser) according to a first embodiment. FIG. 1B is a schematic top view of the surface emitting laser 10. FIG. 1A is a cross-sectional view taken along line V-V of FIG. 1B. The configuration of the surface emitting laser 10 will be described with reference to FIGS. 1A and 1B.

First, an outline of the configuration of the surface emitting laser 10 will be described. The surface emitting laser 10 includes a substrate 11, a semiconductor structure layer (light-emitting structure layer) EM formed on the substrate 11 and including a light-emitting layer 14, and first and second multilayer reflectors (hereinafter, simply referred to as first and second reflectors, respectively) 12 and 19 disposed to face each other with the semiconductor structure layer EM interposed therebetween.

The surface emitting laser 10 has first and second electrodes E1 and E2 configured to apply a voltage to the semiconductor structure layer EM. In the present embodiment, the surface emitting laser 10 has a structure in which the second reflector 19 is bonded to a mounting substrate (not shown) to face the same. The surface emitting laser 10 has connection electrodes (not shown) extending from the first and second electrodes E1 and E2 to the opposite side of the substrate 11 and connected to terminals or wirings of the mounting substrate, respectively. In the present embodiment, the surface emitting laser 10 is mounted by flip-chip mounting.

An outline of the operation of the surface emitting laser 10 will next be described. The first and second reflectors 12 and 19 constitute a resonator in which a direction perpendicular to the semiconductor structure layer EM is a resonator length direction. When a voltage is applied between the first and second electrodes E1 and E2, light is emitted from the light-emitting layer 14 of the semiconductor structure layer EM. The light emitted from the light-emitting layer 14 is repeatedly reflected between the first and second reflectors 12 and 19 to reach a resonance state (laser oscillation is performed).

Also, in the present embodiment, the first reflector 12 has a slightly lower reflectivity than the second reflector 19. Therefore, a part of the light having resonated between the first and second reflectors 12 and 19 passes through the first reflector 12 and the substrate 11 to be extracted to the outside. In this manner, the surface emitting laser 10 emits light in a direction perpendicular to the substrate 11 and the semiconductor structure layer EM.

Next, a detailed configuration of the surface emitting laser 10 will be described. In the present embodiment, the first reflector 12 is formed on the substrate 11, and has a structure in which a first semiconductor film (hereinafter, referred to as a high refractive-index semiconductor film) H1 and a second semiconductor film (hereinafter, referred to as a low refractive-index semiconductor film) L1 having a refractive index lower than that of the high refractive-index semiconductor film H1 are alternately stacked on one another. That is, in the present embodiment, the first reflector 12 is a semiconductor multilayer reflector and constitutes a distributed Bragg reflector (DBR: Distributed Bragg Reflector) formed from a semiconductor material.

In the present embodiment, the substrate 11 has a composition of GaN. The substrate 11 is a growth substrate used for crystal growth of the first reflector 12 and the semiconductor structure layer EM. The high refractive-index semiconductor layer H1 in the first reflector 12 has a composition of GaN, and the low refractive-index semiconductor layer L1 has a composition of AlInN.

In the present embodiment, the layer of the first reflector 12 closest to the substrate 11 is the high refractive-index semiconductor layer H1, and the layer of the first reflector 12 closest to the semiconductor structure layer EM is tee low refractive-index semiconductor layer L1. In the present embodiment, a buffer layer (not shown) as provided between the substrate 11 and the first reflector 12.

The semiconductor structure layer EM has a structure in which the light-emitting layer 14 is sandwiched between an n-type semiconductor layer (first semiconductor layer) 13 and a p-type semiconductor layer (second semiconductor layer) 15. In the present embodiment, the semiconductor structure layer EM includes the n-type semiconductor layer 13 formed on the first reflector 12, the light-emitting layer 14 formed on the n-type semiconductor layer 13, and the p-type semiconductor layer 15 formed on the light-emitting layer 14. The n-type semiconductor layer 13 is connected to the first electrode E1, and the p-type semiconductor layer 15 is connected to the second electrode E2.

In the present embodiment, the semiconductor structure layer EM is formed from a nitride-based semiconductor. In the present embodiment, the n-type semiconductor layer 13 has a composition of GaN and contains Si as an n-type impurity. The light-emitting layer 14 has a composition of InGaN. The p-type semiconductor layer 15 has a composition of GaN and contains Mg as a p-type impurity.

The structure of the semiconductor structure layer EM is not limited to this. For example, the n-type semiconductor layer 13 may include a plurality of n-type semiconductor layers having compositions different from each other. The light-emitting layer 14 may have a multiple quantum-well structure formed from a well layer having a composition of InGaN and a barrier layer having a composition of GaN. The p-type semiconductor layer 15 may include a plurality of p-type semiconductor layers having compositions different from each other.

For example, the p-type semiconductor layer 15 may have, for example, an AlGaN layer at the interface with the light-emitting layer 14 as an electron blocking layer (not shown) configured to prevent electrons injected into the light-emitting layer 14 from overflowing to the p-type semiconductor layer 15. The p-type semiconductor layer 15 may have a contact layer (not shown) on the surface on the second reflector 19 side for forming an ohmic contact with the second electrode E2. In this case, the p-type semiconductor layer 15 may have, for example, a GaN layer as an intermediate layer between the electron blocking layer and the contact layer.

The surface emitting laser 10 has a current confinement layer 15A that confines a current path in the semiconductor structure layer EM and defines a light-emitting region of the light-emitting layer 14 and a center thereof. In the present embodiment, the current confinement layer 15A is a portion having a higher electric resistance than those in other regions on the surface of the GaN layer as the p-type semiconductor layer 15. For example, in the present embodiment, the current confinement layer 15A is a surface region of a GaN layer having been subjected to a high resistance treatment by injecting ions thereinto.

The current confinement layer 15A has a current confinement portion CC that confines a current path in the semiconductor structure layer EM, and forms a current injection region into the semiconductor structure layer EM. In the present embodiment, the current confinement portion CC is an opening with an opening diameter D in the current confinement layer 15A. In the present embodiment, the opening of the current path is a surface region of the GaN layer as the p-type semiconductor layer 15 in which ion implantation is not performed.

In the present embodiment, the opening of the current confinement layer 15A as the current confinement portion CC has a circular shape. The current injected from the second electrode E2 passes through the current confinement portion CC and is injected into the semiconductor structure layer EM (the light-emitting layer 14). The current confinement portion CC is not limited to the case where the current confinement portion CC has a circular shape (cylindrical shape). For example, the current confinement portion CC may have various shapes such as a prismatic columnar shape, an elliptical columnar shape, and the like.

The surface emitting laser 10 has a translucent electrode film 16 formed on the current confinement layer 15A. The translucent electrode film 16 is a conductive film having a light-emitting property with respect to the light emitted from the light-emitting layer 14. The translucent electrode film 16 is in contact with the p-type semiconductor layer 15 through the opening of the current confinement layer 15A. That is, the translucent electrode film 16 is formed on the current confinement layer 15A, and is connected to the p-type semiconductor layer 15 via the current confinement portion CC. For example, the translucent electrode film 16 is formed from a metal oxide film such as ITO or IZO. The translucent electrode film 16 is connected to the second electrode E2.

The surface emitting laser 10 includes a light guide layer LG that forms a light guide structure GD. Herein, the light guide structure GD includes a center region R1 extending in a direction perpendicular to the substrate 11 between the first and second reflectors 12 and 19 and including a light emission center of the light-emitting layer 14, and a peripheral region R2 provided around the center region R1 and having a smaller optical distance (a product of a physical distance and an equivalent refractive index in the medium) between the first and second reflectors 12 and 19 than that in the center region R1.

The light-emitting region of the light-emitting layer 14 is, for example, a region having a predetermined width in which light of a predetermined intensity or more is emitted in the light-emitting layer 14, and the center thereof is the light emission center. For example, the light-emitting region of the light-emitting layer 14 is a region into which a current of a predetermined density or more is injected in the light-emitting layer 14, and the center thereof serves as the light emission center. A straight line perpendicular to the substrate 11 passing through the light emission center is a light emission center axis CA. The light emission center axis CA is a straight line extending along the resonator length direction of the resonator constituted by the first and second reflectors 12 and 19.

In the present embodiment, the light emission center of the light-emitting layer 14 is, for example, a portion of the light-emitting layer 14 disposed at a position overlapping with the center of the current confinement portion CC (opening) of the current confinement layer 15A when viewed from a direction perpendicular to the substrate 11. The light emission center axis CA corresponds to the optical axis of the laser light emitted from the surface emitting laser 10.

As schematically shown in FIG. 1B, the center region R1 is a region extending in a cylinder solid shape along the light emission center axis CA. The peripheral region R2 is a region that extends in a hollow cylinder shape along the light emission center axis CA to surround the center region R1. The center region R1 and the peripheral region R2 each have a predetermined width. In addition, there is no need to have a clear boundary between the center region R1 and the peripheral region R2. The optical distance between the first and second reflectors 12 and 19, for example, the equivalent resonance wavelength, may be relatively large in the center region R1 and relatively small in the periphery thereof.

In the present embodiment, the light guide layer LG is provided on the translucent electrode film 16 over the center region R1 and the peripheral region R2. The light guide layer LG includes a first translucent insulating layer 17 disposed on the light emission center axis CA and having a convex portion 17P, and a second translucent insulating layer 18 disposed on the first transmissive insulating layer 17 in the peripheral region R2 and having a smaller refractive index than that of the first translucent insulating layer 17. The convex portion 17P has, for example, a cylindrical shape, and is provided coaxially with the light emission center axis CA.

In other words, a region where the convex portion 17P of the first translucent insulating layer 17 is provided between the first and second reflectors 12 and 19 is the center region R1, and a region where the convex portion 17P is not provided is the peripheral region R2. The width (e.g., diameter) of the convex portion 17P corresponds to the width of the center region R1. The length from the end of the convex portion 17P to the end of the second reflector 19 corresponds to the width of the peripheral region R2.

In the present embodiment, only the first translucent insulating layer 17 is provided in the center region R1, and both the first and second translucent insulating layers 17 and 18 are provided in the peripheral region R2. The second translucent insulating layer 18 is configured such that the upper surface of the second translucent insulating layer 18 is disposed at the same position as the upper surface of the convex portion 17P of the first translucent insulating layer 17. Therefore, in the present embodiment, the upper surface of the light guide layer LG is a flat surface S1 having a flatness property over the center region R1 and the peripheral region R2.

For example, the first translucent insulating layer 17 is formed from a metal oxide such as $Ta_2O_5$, $Nb_2O_5$, $ZrO_2$, $TiO_2$, or $HfO_2$. For example, the second translucent insulating layer 18 is formed from a metal oxide such as $SiO_2$.

In the present embodiment, the first translucent insulating layer 17 is formed from $Ta_2O_5$.

The second reflector 19 is formed on the light guide layer LG (first and second translucent insulating layers 17 and 18), and has a structure in which a first dielectric film (hereinafter, referred to as a high refractive-index dielectric film) H2 and a second dielectric film (hereinafter, referred to as a low refractive-index dielectric film) L2 having a refractive index lower than that of the high refractive-index dielectric film H2 are alternately stacked.

That is, in the present embodiment, the second reflector 19 is a dielectric multilayer reflector, and constitutes a distributed Bragg reflector (DBR: Distributed Bragg Reflector) formed from a dielectric material. In the present embodiment, the high refractive-index dielectric film H2 is formed from a $Ta_2O_5$ layer, and the low refractive-index dielectric film L2 is formed from an $Al_2O_3$ layer.

In the present embodiment, the second reflector 19 is formed on the flat surface S1 which is the upper surface of the light guide layer LG. Accordingly, each of the high refractive-index dielectric film H2 and the low refractive-index dielectric layer L2 in the second reflector 19 has a flatness property over the center region R1 and the peripheral region R2. For example, the second reflector 19 does not have an inclined portion or a bent portion which becomes a step between the center region R1 and the peripheral region R2.

In this specification, a flatness property refers to a planar shape including unevenness within a range insensitive to light emitted from the light-emitting layer 14, that, is, to standing waves (laser light) generated between the first and second reflectors 12 and 19.

For example, suppose a case where the equivalent refractive index between the first and second reflectors 12 and 19 (i.e., in the resonator) in the center region R1 (i.e., the weighted average of the refractive indices of the n-type semiconductor layer 13, the light-emitting layer 14, the p-type semiconductor layer 15, the translucent electrode film 16, and the first translucent insulating layer 17 and the standing wave light distribution) is n1, and the peak wavelength (wavelength in vacuum) of the emitted light from the light-emitting layer 14 is λ1. In this case, the high refractive-index dielectric film H2 and the low refractive-index dielectric film L2 are assumed to have a flatness property when the irregular height HC provided on the surfaces of the high refractive-index dielectric film H2 and the low refractive-index dielectric film L2 and on the interfaces therebetween are within the range of HC<λ1/(n1·20). More preferably, the irregular height HC falls within the range of HC<λ1/(n1·50).

For example, in the present embodiment, the light-emitting layer 14 has a composition of InGaN, and the peak wavelength of the light emitted from the light-emitting layer 14 is about 445 nm (λ1=445 nm). In the present embodiment, the equivalent refractive indices of the first and second reflectors 12 and 19 in the center region R1 is about 2.43. In this case, for example, the irregular height HC of the high refractive-index dielectric film H2 at the interface with the light guide layer LG may be preferably about 9.2 nm (=445/(2.43*20)) or less, and more preferably about 4.7 nm (=445/(2.43*50)) or less.

Here, an exemplary configuration of each layer in the surface emitting laser 10 will be described. In the present embodiment, the first reflector 12 is formed from 44 pairs of GaN and AlInN layers. The n-type semiconductor layer 13 has a layer thickness of 650 nm. The light-emitting layer 14 is formed from an active layer having a multiple quantum-well structure in which an InGaN layer of 4 nm and a GaN layer of 5 nm are stacked three times. The p-type semiconductor layer 15 has a layer thickness of 50 nm. The current confinement portion CC in the current confinement layer 15A has an opening diameter of 10 µm. The convex portion 17A of the first translucent insulating layer 17 has a diameter of 6 µm. The second reflector 19 is formed from 10 pairs of $Ta_2O_5$ and $Al_2O_3$ layers. Note that these components are merely examples.

Figure 2A:
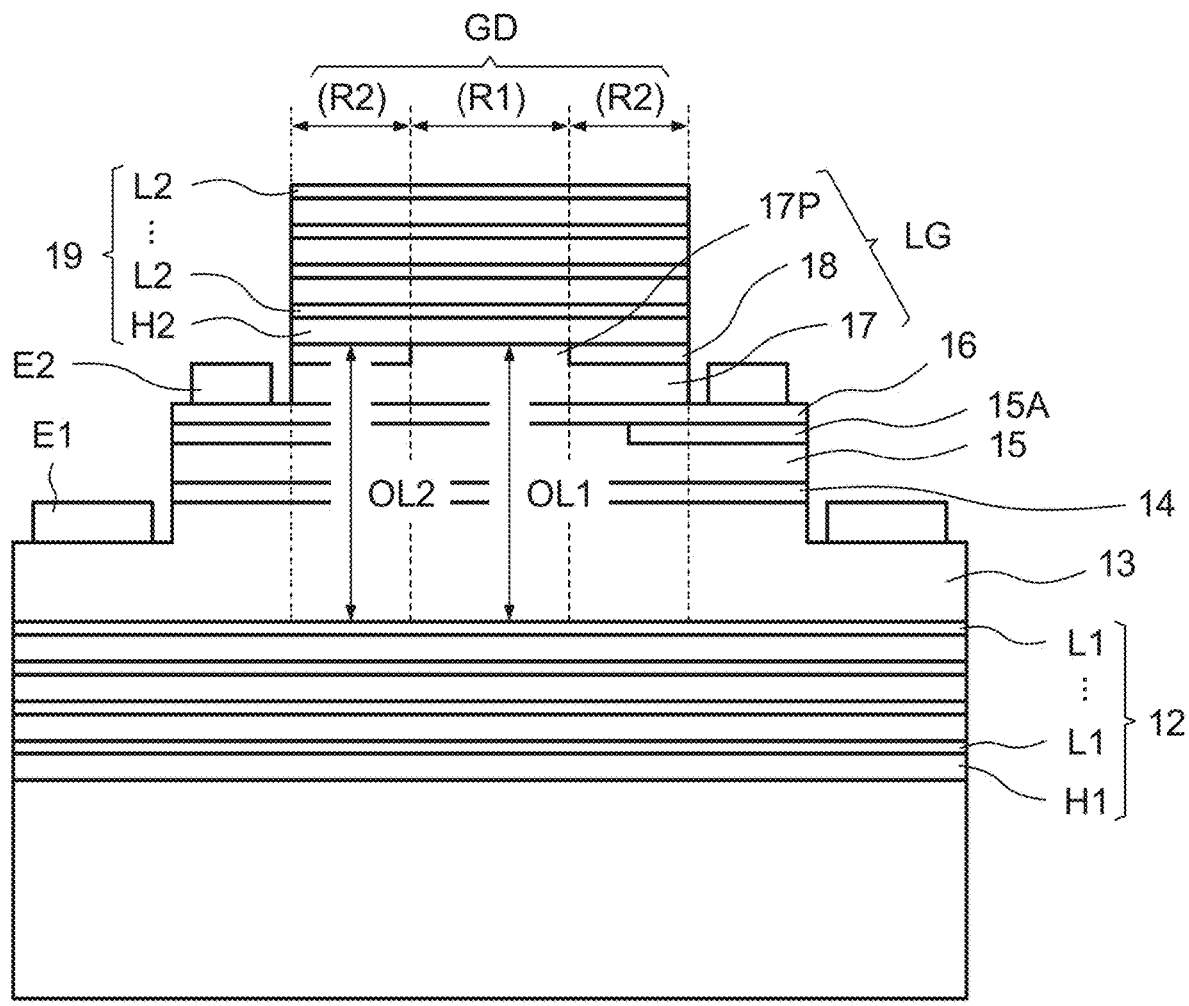
FIG. 2A is a schematic cross-sectional view of the surface emitting laser according to the first embodiment.
Figure 2B:
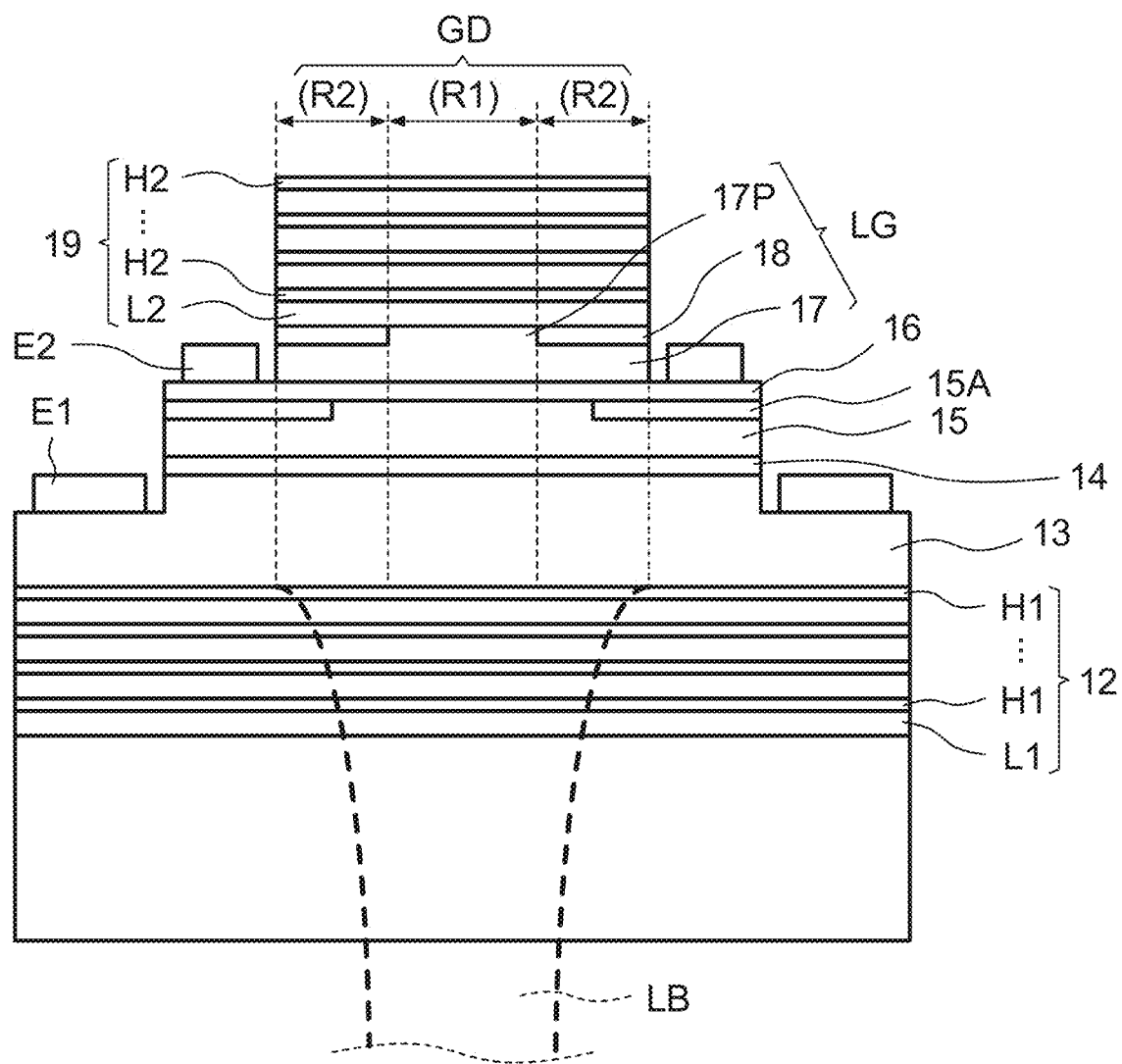
FIG. 2B is a diagram schematically showing light emitted from the surface emitting laser according to the first embodiment.

FIG. 2A is a diagram schematically showing an optical distances between the first and second reflectors 12 and 19 in the center region R1 and the peripheral region R2. FIG. 2B is a diagram schematically showing light emitted from the surface emitting laser 10.

First, as shown in FIG. 2A, in the present embodiment, the light guide layer LG as a whole has the same layer thickness in both the center region R1 and the peripheral region R2. On the other hand, the light guide layer LG is formed only from the first translucent insulating layer 17 in the center region R1, and is formed only from the first and second translucent insulating layers 17 and 18 in the peripheral region R2.

Therefore, in the present embodiment, the optical distances between the first and second reflectors 12 and 19 differ from each other due to the difference in layer configuration between the center region R1 and the peripheral region R2 in the light guide layer LG. The refractive index of the second translucent insulating layer 18 is smaller than that of the first translucent insulating layer 17. Therefore, the (average) refractive index of the right guide layer LG in the peripheral region R2 is smaller than the (average) refractive index of the light guide layer LG in the center region R1.

Therefore, when the optical distance between the first and second reflectors 12 and 19 in the center region R1 is referred to as an optical distance OL1, and the optical distance between the first and second reflectors 12 and 19 in the peripheral region R2 is referred to as an optical distance OL2, the optical distance OL2 is smaller than the optical distance OL1. In other words, the equivalent resonator length (resonance wavelength) in the peripheral region R2 is smaller than the equivalent resonator length in the center region R1.

FIG. 2B is a diagram schematically showing light emitted from the surface emitting laser 10. In the present embodiment, the standing wave in the surface emitting laser 10 is taken out from the first reflector 12 to the outside. Here, as shown in FIG. 2B, the light having resonated in the surface emitting laser 10 is extracted to the outside while converging in the center region R1. In FIG. 2B, the outer edge of beam of the laser light LB emitted from the surface emitting laser 10 is schematically shown by broken lines.

Specifically, in the present embodiment, the provision of the light guide layer LG (light guide structure GD) makes the optical distance OL2 between the reflectors in the peripheral region R2 smaller than the optical distance OL1 between the reflectors in the center region R1. Therefore, the equivalent refractive index of the medium between the reflectors in the peripheral region R2 is smaller than the equivalent refractive index between the reflectors in the center region R1.

This suppresses optical loss due to the standing wave in the resonator diverging (radiating) outward from the center region R1. That is, a larger amount of light remains in the center region R1, and in this state, the laser light LB is taken out to the outside. Therefore, a large amount of light is concentrated in the vicinity of the light emission center axis CA, and the laser light LB having a unimodal or multimodal intensity distribution can be generated and emitted stably.

In consideration of generating the unimodal or multimodal laser light LB, for example, it is conceivable that a layer or a portion that absorbs light may be provided in the peripheral region R2. However, in the present embodiment, the light guide structure GD is formed by providing a difference in refractive index between the center region R1 and the peripheral region R2. Therefore, it is possible to generate the unimodal laser light LB by using almost all the light without a decrease in intensity.

In the present embodiment, the second reflector 19 is formed from a flat dielectric film over the center region R1 and the peripheral region R2. Therefore, the light scattering loss between the first and second reflectors 12 and 19 is suppressed. If the second reflector 19 has a step between the center region R1 and the peripheral region R2, light is scattered at the step portion, and stable reflection is less likely to occur. In the present embodiment, the first and second reflectors 12 and 19 have a flatness property over the entire center region R1 and peripheral region R2. Therefore, a resonator in which the scattering loss is greatly reduced is obtained.

Therefore, the surface emitting laser 10 is produced as a semiconductor laser that stably emits high-output laser light LB while reducing a threshold voltage. In addition, suppressing the above-mentioned various losses can drastically improve the relationship of the output intensity to the operating current, that is, the slope efficiency. Accordingly, it is possible to provide the surface emitting laser 10 which has a low threshold and a high output and can generate stable laser light LB.

Figure 3:
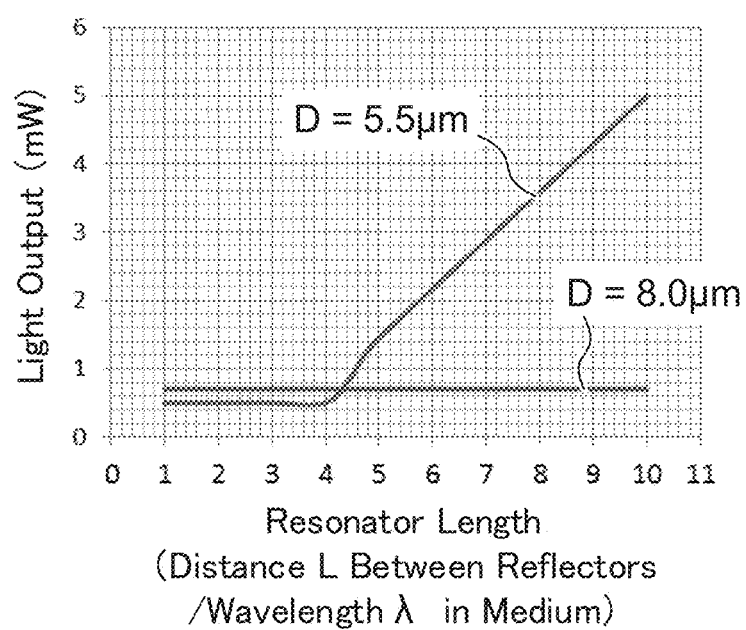
FIG. 3 is a diagram showing a relationship among the resonator length, the width of a current path in a semiconductor structure layer, and a light output of the surface emitting laser according to the first embodiment.

FIG. 3 is a diagram showing a relationship between a resonator length, a current confinement diameter, and a light output in the surface emitting laser 10. The horizontal axis in the drawing indicates values obtained by dividing the resonator length of the surface emitting laser 10, i.e., in the present embodiment, the distance (physical distance, hereinafter referred to as resonator length) L between the first and second reflectors 12 and 19 in the center region R1, by the wavelength (the value obtained by dividing emission wavelength $\lambda 1$ by the equivalent index n1, hereinafter referred to as the wavelength in the medium) $\lambda$ of the light emitted from the light-emitting layer 14 in the medium of the center region. R1.

In the present embodiment, the medium in the center region R1 refers to the entirety of the n-type semiconductor layer 13, the light-emitting layer 14, the p-type semiconductor layer 15, the translucent electrode film 16, and the first translucent insulating layer 17 that are the elements provided in the center region R1. In addition, the vertical axis in the drawing indicates the output of the light component of the single mode of the laser light LB emitted from the surface emitting laser 10.

FIG. 3 shows, as a typical example, the light output from the surface emitting laser 10 in which the opening diameter D (see FIG. 1) of the current confinement portion CC, which is the current confinement diameter, is variously adjusted, when the resonator length L is variously adjusted after setting the opening diameter D to 5.5 µm or 8.0 µm. In the present embodiment, the layer thickness of the n-type semiconductor layer 13 is adjusted in order to adjust the resonator length L.

First, the inventors of the present application have found that the lateral mode in the oscillation mode of the laser light LB can be stabilized by appropriately setting the opening diameter D of the current confinement portion CC and the resonator length L in the surface emitting laser 10. This makes it possible to stably generate, for example, high-output unimodal laser light LB.

Specifically, the resonator length L is preferably four times or more the wavelength λ of the light emitted from the light-emitting layer 14 in the medium, and the current confinement diameter is preferably 5.5 μm or less. As a result, as shown in FIG. 3, it can be seen that the light output of the laser light LB oscillating in the single mode increases in proportion to the resonator length L.

This is because, first, the longer the resonator length L is, the smaller the difference in the equivalent refractive index between the center region R1 and the peripheral region R2 in the medium (laser medium) becomes. If the difference in equivalent refractive index between the center region R1 and the peripheral region R2 is small, the number of modes satisfying the condition of total reflection is limited, and the number of higher-order modes that can exist in the center region R1 can be reduced. Further, as the resonator length L is longer, the difference in the diffraction loss between the light component of the higher-order mode and the light component of the single mode, which is the fundamental mode, increases. Therefore, the longer the resonator length is, the larger the ratio of the single mode light components in the laser light LB becomes.

In addition, the inventors of the present application have found that the longer the resonator length L is, the more the heat generation (temperature rise) of the light-emitting region is suppressed. Further, the inventors of the present application have found that by suppressing the heat generation of the light-emitting region, it is possible to suppress the occurrence of an unintended thermal lens effect in the laser medium, and it is possible to suppress the increase of the higher-order mode. These could be confirmed by experiments conducted by the inventors of the present application.

For example, when the equivalent refractive index of the center region R1 is referred to a refractive index n1 and the equivalent refractive index of the peripheral region R2 is referred to as a refractive index n2, the relative refractive index difference Δn of the refractive indices n1 and n2 can be defined as (n1−n2)/n1. The relative refractive index difference Δn preferably satisfies the relation $\Delta n \leq 1.0 \times 10^{-2}$. For example, in the present embodiment, a surface emitting laser 10 in which the resonator length L was set to 10 times the wavelength λ in the medium was produced. In this surface emitting laser 10, the relative refractive index difference Δn was about $1.5 \times 10^{-3}$.

Next, the inventors of the present application have confirmed that the laser light LB dominantly having a single mode light component is emitted by setting the resonator length L to be equal to or more than four wavelengths of the wavelength λ in the medium and setting the current confinement diameter to be equal to or less than 5.5 μm. Accordingly, by satisfying this condition, the single mode optical output is increased by increasing the resonator length, and stable, unimodal and high output laser light LB is emitted. When the opening diameter D of the current confinement portion CC was larger than 5.5 μm, for example, and when the opening diameter D was 8.0 μm, the laser oscillation in the single mode was not stabilized as shown in FIG. 3, and even if the resonator length L was increased, the light output in the single mode did not increase.

In this manner, in consideration of obtaining a high output unimodal laser light LB, the first and second reflectors 12 and 19 are provided therebetween with the current confinement layer 15A that narrows the current path within the semiconductor structure layer EM and defines the light emission center axis CA (the light emission center of the light-emitting layer 14), and the current confinement layer 15A preferably has the current confinement portion CC that forms an opening in the current path and has an opening diameter D of 5.5 μm or less. The resonator length L, that is, the distance between the first and second reflectors 12 and 19 in the center region R1 in the present embodiment is preferably four times or more the wavelength λ of the light emitted from the light-emitting layer 14 in the medium.

In the present embodiment, the case where the laser light LB is emitted from the first reflector 12 through the substrate 11 has been described. In this case, it is preferable to provide an anti-reflection film (AR coating) on the surface of the substrate 11 opposite to the first reflector 12. However, the surface emitting laser 10 is not limited to the case where the laser light LB is emitted from the first reflector 12 side. The surface emitting laser 10 may be configured to emit the laser light LB from the second reflector 19 side. In this case, for example, the first and second reflectors 12 and 19 may be configured so that the light reflectance of the second reflector 19 is smaller than that of the first reflector 12.

In the present embodiment, the case where the current confinement layer 15A is formed as a high resistance region on part of the surface of the GaN layer has been described. However, the configuration of the current confinement layer 15A is not limited to this. For example, the current confinement layer 15A may be configured as an insulating layer provided on the semiconductor structure layer EM. In this case, the insulating layer may have an opening that functions as the current confinement portion CC.

In the present embodiment, the case where the first reflector 12 is a semiconductor multilayer reflector and the second reflector 19 is a dielectric multilayer reflector has been described. However, the configuration of the first and second reflectors 12 and 19 is not limited to this. For example, the second reflector 19 may be a semiconductor multilayer reflector, or both the first and second reflectors 12 and 19 may be dielectric multilayer reflectors. Each of the first and second reflectors 12 and 19 only needs to be a multilayer reflector in which a plurality of films having different refractive indices are stacked.

In the present embodiment, the case where the light guide layer LG is formed from the first and second translucent insulating layers 17 and 18 formed between the translucent electrode film 16 and the second reflector 19 has been described. The case where the first translucent insulating layer 17 has the convex portion 17P and the second translucent insulating layer 18 is formed on the first translucent insulating layer 17 so as to have the upper surface having the same height as the convex portion 17P has also been described. However, the configuration of the light guide layer LG is not limited to this. The light guide layer LG only needs to be configured to have an equivalent refractive index higher in the center region R1 than in the peripheral region R2, for example.

For example, the second translucent insulating layer 18 may be formed on the convex portion 17P. That is, the second translucent insulating layer 18 only needs to be formed at least on the first translucent insulating layer 17 in the peripheral region R2. Furthermore, the second translucent insulating layer 18 only needs to be configured to flatten the upper surface of the light guide layer LG. For example, the second translucent insulating layer 18 only needs to be formed on the first translucent insulating layer 17 in the peripheral region R2 so as to flatten the upper surface of the light guide layer LG.

Furthermore, for example, another translucent insulating layer may be provided between the first and second translucent insulating layers 17 and 18. Further, for example, the light guide layer LG may be configured to form an intermediate region, which is an intermediate optical distance between the center region R1 and the peripheral region R2, between the regions R1 and R2 as the light guide structure GD.

In the present embodiment, the case where the light guide layer LG has a flat upper surface has been described. However, the configuration of the light guide layer LG is not limited thereto as long as the second reflector 19 has a flatness property over the center region R1 and the peripheral region R2. The light guide layer LG only needs to have a light guide structure GD including the center region R1 and the peripheral region R2 formed between the first and second reflectors 12 and 19.

Thus, the surface emitting laser 10 includes the substrate 11, the first multilayer reflector 12 formed on the substrate 11, the semiconductor structure layer EM formed on the first multilayer reflector 12 and including the light-emitting layer 14, and the second multilayer reflector 19 formed on the semiconductor structure layer EM and constituting a resonator with the first multilayer reflector 12.

In addition, the surface emitting laser 10 has the light guide layer LG that forms the light guide structure GD including: the center region R1 extending in a direction perpendicular to the substrate 11 and provided on the light-emitting region (the region including the light emission center axis CA passing through the light emission center) of the light-emitting layer 14 between the first end second multilayer reflectors 12 and 19; and the peripheral region R2 provided around the center region R1 and having the smaller optical distance between the first and second multilayer reflectors 12 and 19 than that in the center region R1. The second multilayer reflector 19 has a flatness property over the center region R1 and the peripheral region R2. Accordingly, it is possible to provide the surface emitting laser 10 (and the vertical cavity light-emitting element) having a low threshold and a high output.

Second Embodiment

Figure 4:
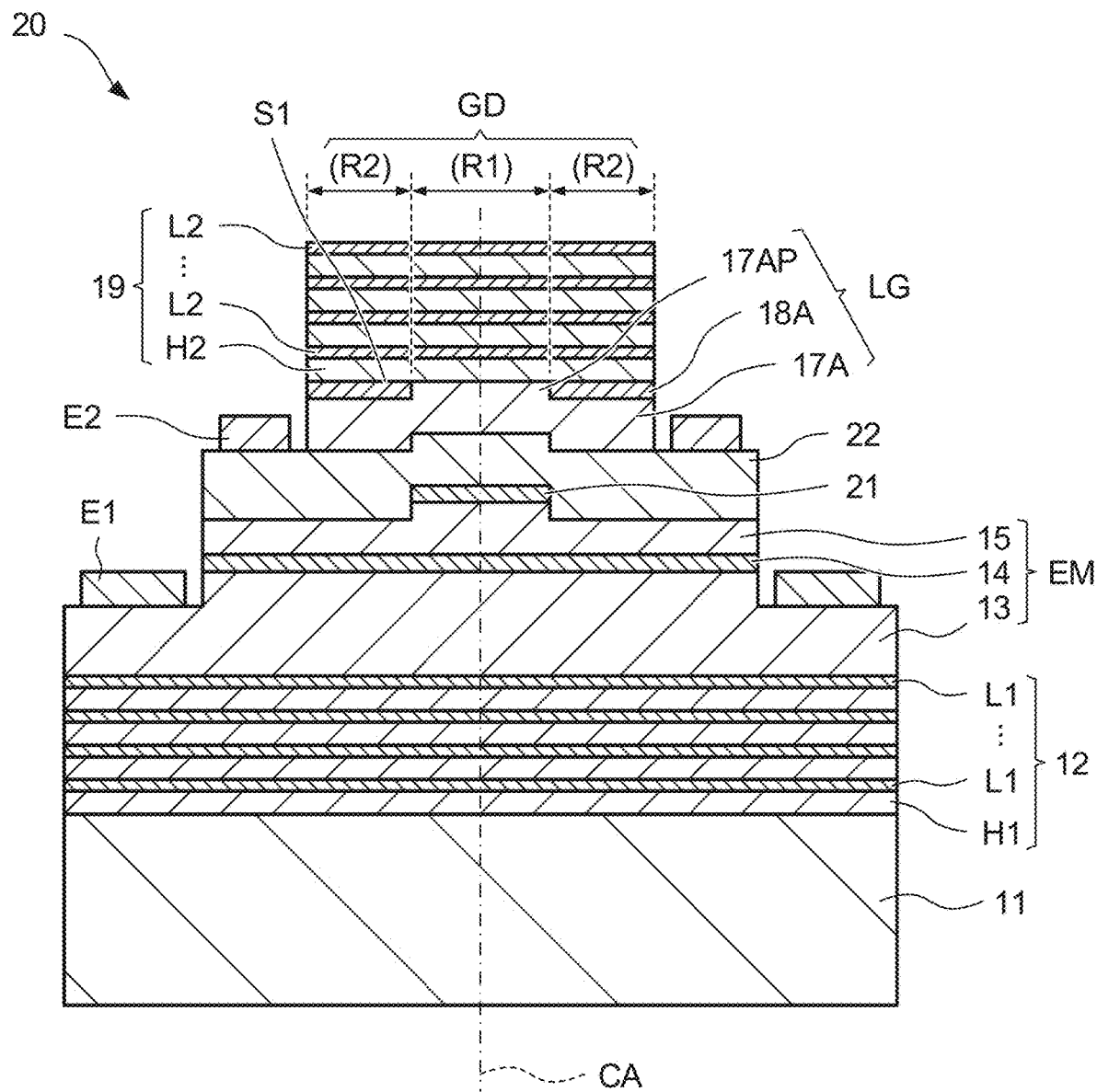
FIG. 4 is a cross-sectional view of a surface emitting laser according to a second embodiment.

FIG. 4 is a cross-sectional view of a surface emitting laser 20 according to a second embodiment. The surface emitting laser 20 has the same configuration as that of the surface emitting laser 10 except that it has a current confinement structure due to tunnel junctions.

As shown in FIG. 4, the surface emitting laser 10 includes a tunnel junction layer 21 disposed on the p-type semiconductor layer 15 and an n-type semiconductor layer (second n-type semiconductor layer or third semiconductor layer) 22 disposed on the tunnel junction layer 21 and p-type semiconductor layer 15 while embedding the tunnel junction layer 21 from above.

In the present embodiment, the tunnel junction layer 21 is formed on the p-type semiconductor layer 15, and includes a high-doped p-type semiconductor layer (not shown) having an impurity concentration higher than that of the p-type semiconductor layer (second semiconductor layer) 15, and a high-doped n-type semiconductor layer (not shown) formed on the high-doped p-type semiconductor layer and having an impurity concentration higher than that of the n-type semiconductor layer (first n-type semiconductor layer or first semiconductor layer) 13.

In the present embodiment, the second electrode E2 is formed on the n-type semiconductor layer 22. The light guide layer LG has a first translucent insulating layer 17A formed on the n-type semiconductor layer 22 and having a convex portion 17AP in the center region R1, and a second translucent insulating layer 18A formed on the first translucent insulating layer 17 in the peripheral region R2. The first and second translucent insulating layers 17A and 18A and the convex portion 17AP have the same configurations as those of the first and second translucent insulating layers 17 and 18 and the convex portion 17P in the surface emitting laser 10, respectively.

In the present embodiment, the tunnel junction layer 21 functions as a current confinement layer, and the region of the tunnel junction layer 21 functions as a current confinement portion CC. The center of the tunnel junction layer 21 corresponds to the position of the light emission center of the light-emitting layer 14, and a straight line passing through the center and perpendicular to the substrate 11 is the light emission center axis CA. That is, in the present embodiment, the current confinement layer that confines the current path in the semiconductor structure layer EM and defines the light emission center and the light-emitting region of the light-emitting layer 14 has the tunnel junction layer 21.

On the n-type semiconductor layer 22, a convex portion that takes over the shape of the tunnel junction layer 21 is provided. The convex portion 17AP of the first translucent insulating layer 17A is a portion protruding from other regions corresponding to the region of the tunnel junction layer 21. The second translucent insulating layer 17A is formed on the first translucent insulating layer 17A in the peripheral region R2 so as to have an upper surface corresponding to the height of the convex portion 17AP.

In other words, in the present embodiment, the region of the tunnel junction layer 21 is the current confinement portion CC, and the center region R1 and the peripheral region R2 are defined by the convex portion 17AP of the first translucent insulating layer 17A corresponding to the current confinement portion CC. Therefore, the width of the tunnel junction layer 21 corresponds to the width of the center region R1.

When the current confinement structure is formed using the tunnel junction as in the present embodiment, all the laser medium except the light guide layer LG are semiconductor layers between the first and second reflectors 12 and 19. Therefore, the positional accuracy of each layer is stabilized, and the surface emitting laser 20 has optical characteristics close to the designed characteristics.

Also in the surface emitting laser 20 having the current confinement structure using the tunnel junction as in the present embodiment, the light guide layer LG can form the light guide structure GD including the center region R1 and the peripheral region R2 in which the optical distances between the first and second reflectors 12 and 19 are different from each other. Furthermore, since the upper surface of the light guide layer LG is formed as a flat surface S1, the second reflector 19 on the light guide layer LG has a flatness property over the center region R1 and the peripheral region R2. Accordingly, it is possible to provide the surface emitting laser 20 with a low threshold and a high output.

Third Embodiment

Figure 5:
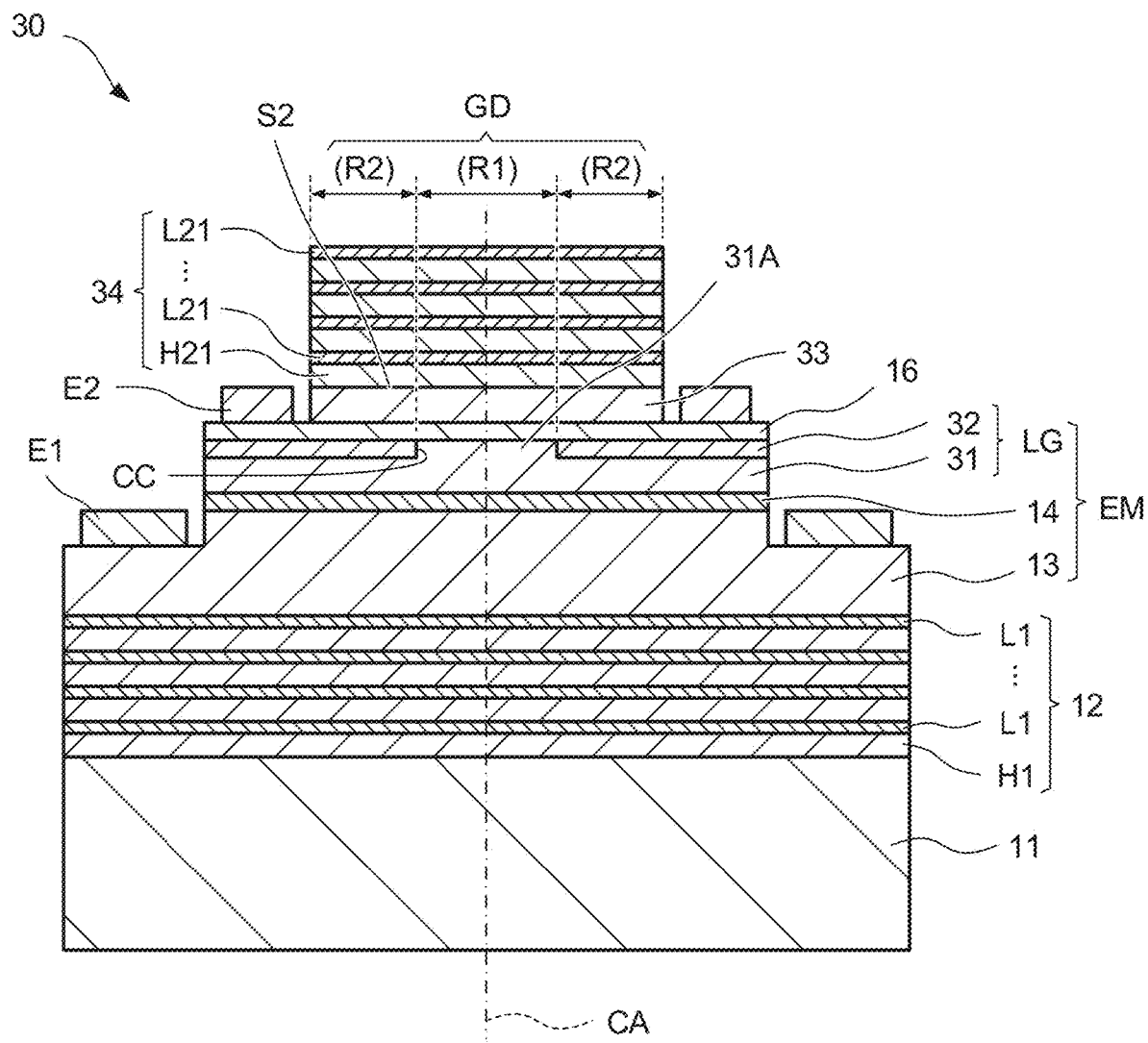
FIG. 5 is a cross-sectional view of a surface emitting laser according to a third embodiment.

FIG. 5 is a cross-sectional view of a surface emitting laser 30 according to a third embodiment. The surface emitting laser 30 has the same configuration as that of the surface emitting laser 10 except that the p-type semiconductor layer (second semiconductor layer) 31 within true semiconductor structure layer EM constitutes the light guide layer LG.

Specifically, the semiconductor structure layer EM has a p-type semiconductor layer 31 formed on the light-emitting layer 14 and having a convex portion 31A in the center region R1. The surface emitting laser 30 has a translucent insulating layer 32 formed on the p-type semiconductor layer 31 in the peripheral region R2 and having a smaller refractive index than that of the p-type semiconductor layer 31. In the present embodiment, the light guide layer LG includes the p-type semiconductor layer 31 and the translucent insulating layer 32. The translucent insulating layer 32 is formed from, for example, $SiO_2$.

The translucent insulating layer 32 is formed on the p-type semiconductor layer 31 in the peripheral region R2 so as to cover the side surface of the convex portion 31A of the p-type semiconductor layer 31. The translucent insulating layer 32 is formed on the p-type semiconductor layer 31 so that the upper surface of the convex portion 31A of the p-type semiconductor layer 31 and the upper surface of the translucent insulating layer 32 are flush with each other. That is, the translucent insulating layer 32 is formed on the p-type semiconductor layer 31 in the peripheral region R2 so as to flatten the upper surface of the light guide layer LG. Accordingly, the upper surface of the light guide layer LG is a flat surface 32 having a flatness property across the center region R1 and the peripheral region R2.

In the present embodiment, the translucent insulating layer 32 of the light guide layer LG functions as a current confinement layer. A portion of the translucent insulating layer 32 covering the side surface of the convex portion 31A of the p-type semiconductor layer 31 forms an opening as a current confinement portion CC. Therefore, in the present embodiment, the light guide layer LG not only forms the light guide structure GD but also has a current confinement structure.

On the p-type semiconductor layer 31, a translucent electrode film 16 is formed on the translucent electrode layer 32 while being in contact with the upper surface of the convex portion 31A, and the second electrode E2 is connected to the translucent electrode film 16.

In the present embodiment, an insulating layer 33 is formed on the translucent electrode film 16, and a second reflector 34 is formed on the insulating layer 33. The insulating layer 33 is provided as a spacer layer (phase adjusting layer) for defining the resonator length. In the present embodiment, the insulating layer 33 is formed from an $Nb_2O_5$ layer. The second reflector 34 has a structure in which an $Nb_2O_5$ layer as the high refractive-index dielectric film H21 and an $SiO_2$ layer as the low refractive-index dielectric film L21 are stacked a plurality of times. In the present embodiment, the second reflector 34 is a dielectric multilayer reflector.

By forming the light guide layer LG using a semiconductor layer as is the present embodiment, the light, guide layer LG can have a current confining function. Accordingly, it is possible to provide the surface emitting laser 30 having a low threshold and a high output while simplifying the configuration.

For example, also in the surface emitting laser 30, the oscillation mode can be stabilized (for example, oscillation can be performed in a single mode) by appropriately adjusting the current confinement diameter (opening diameter D) and the resonator length L described with reference to FIG. 3 in the first embodiment.

That is, in the surface emitting laser 30, the translucent insulating layer 32 functions as a current confinement layer that confines a current path in the semiconductor structure layer EM and defines a light emission center axis CA (light emission center of the light-emitting layer 14). For example, it is preferable that the translucent insulating layer 32 as the current confinement layer form an opening of the current path and have a current confinement portion CC having an opening diameter D of 5.5 μm or less.

In addition, it is preferable that the distance L between the first and second reflectors 12 and 19 in the center region R1 be four times or more of the wavelength λ of light emitted from the light-emitting layer 14 in the medium in the center region R1. In the present embodiment, the medium in the center region R1 refers to the entirety of the n-type semiconductor layer 13, the light-emitting layer 14, the p-type semiconductor layer 31, the translucent electrode film 16, and the insulating layer 33.

As an example of adjusting the resonator length L in the surface emitting laser 30, each layer of the surface emitting laser 30 has, for example, the following configuration. The n-type semiconducting layer 13 is formed from an n-GaN layer having a layer thickness of 1570 nm. The light-emitting layer 14 is formed from active layers of a multiple quantum-well structure in which three InGaN layers (well layers) with a thickness of 4 nm and three GaN layers (barrier layers) with a thickness of 5 nm are alternately stacked.

The p-type semiconductor layer 31 has the convex portion 31A having a diameter of 5.5 μm in the center region R1, and the p-GaN layer having a layer thickness of 50 nm in the center region R1 and a layer thickness of 30 nm in the peripheral region R2. The translucent insulating layer 32 is formed from an $SiO_2$ layer with a layer thickness of 20 nm on the surface of the p-type semiconductor layer 31 except for the upper surface of the convex portion 31A of the p-type semiconductor layer 31. The translucent electrode film 16 is formed from an ITO film having a layer thickness of 20 nm. The insulating layer 33 is formed from an $Nb_2O_5$ layer having a layer thickness of 40 nm.

For example, by adjusting the layer thickness of each layer in this manner, a resonator having a resonator length L corresponding to ten times the wavelength λ of the light emitted from the light-emitting layer 14 in the medium can be configured. When the light output from the surface emitting laser 30 was measured, single-mode laser light LB having an output of about 5 mW was obtained. The emission angle of the laser light LB was about 5.1°.

As described above, by adjusting the current confinement diameter and the resonator length, it is possible to obtain the laser light LB having a high output and a stable unimodal property. Also in the other embodiments in this specification, the effect as shown in FIG. 3, for example, can be obtained by performing the same adjustment.

Fourth Embodiment

Figure 6:
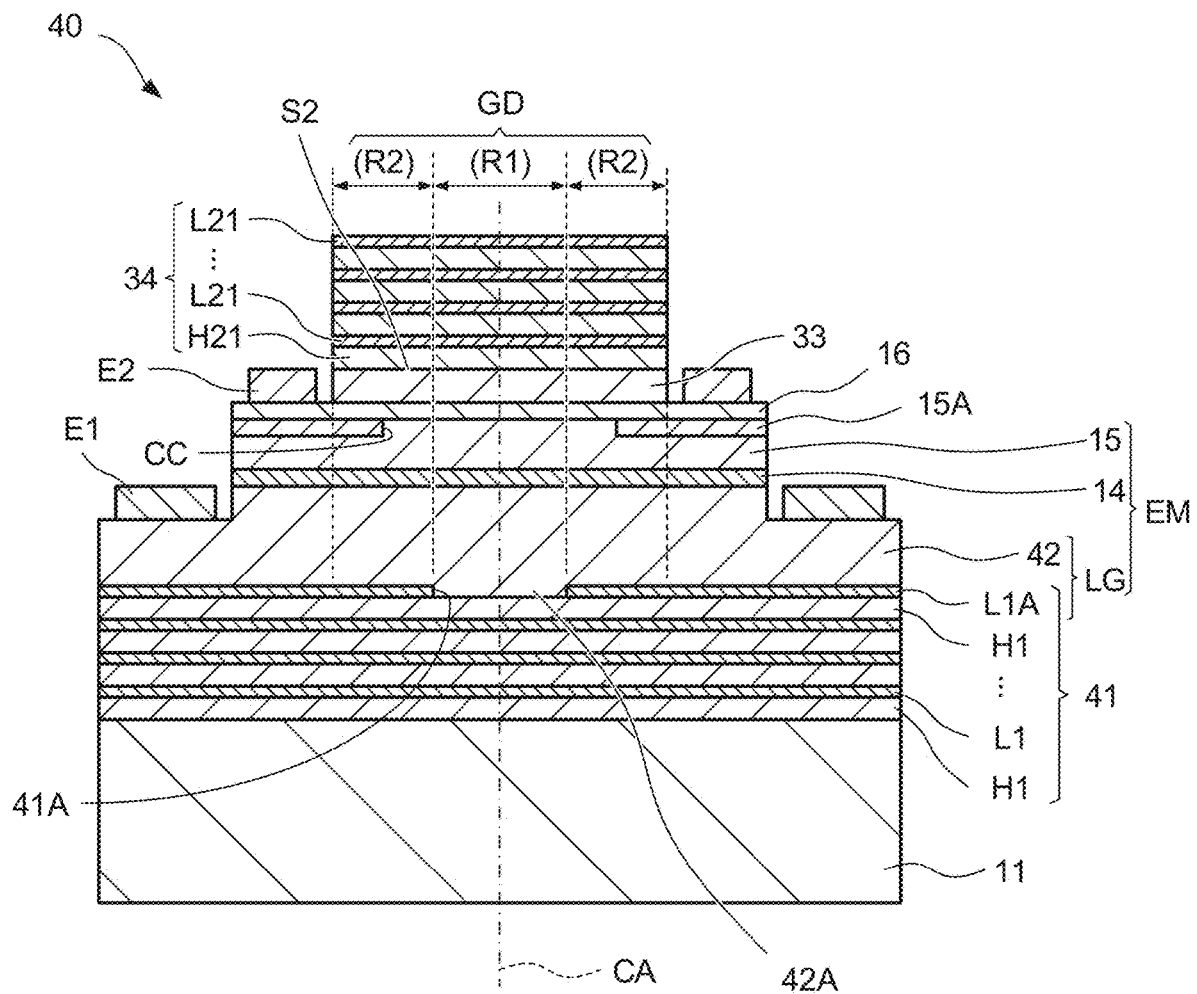
FIG. 6 is a cross-sectional view of a surface emitting laser according to a fourth embodiment.

FIG. 6 is a cross-sectional view of a surface emitting laser 40 according to a fourth embodiment. The surface emitting laser 40 has the same configuration as that of the surface emitting laser 30 except that the light guide layer LG is composed of a part of the first reflector 41 and the n-type semiconductor layer 42.

In the surface emitting laser 40, the first reflector 41 has a concave portion 41A in tire center region R1. In the present embodiment, a low refractive-index semiconductor film L1A, which is the semiconductor film closest to the n-type semiconductor layer 42 in the first reflector 41, has an opening as the concave portion 41A in the center region R1.

More specifically, the first reflector 41 has a structure in which a high refractive-index semiconductor film (first semiconductor film) H1, and a low refractive-index semiconductor film (second semiconductor film) L1 having a smaller refractive index than those of the high refractive-index semiconductor film H1 and the n-type semiconductor layer (first semiconductor layer) 13 of the semiconductor structure layer EM are alternately stacked a plurality of times. The first reflector 41 has the low refractive-index semiconductor film L1A provided closest to the n-type semiconductor layer 13 and having an opening in the center region R1.

The n-type semiconductor layer 42 has a burying portion 42A configured to bury the concave portion 41A of the first reflector 41. The n-type semiconductor layer 42 has a flat upper surface. The respective layers from the light-emitting layer 14 to the insulating layer 33 are formed on the flat n-type semiconductor layer 42. The second reflector 34 is formed on the flat surface 32 which is the upper surface of the insulating layer 33.

In the present embodiment, the low refractive-index semiconductor film L1A and the n-type semiconductor layer 42 of the first reflector 41 constitute the light guide layer LG. In addition, in the light guide layer LG in the present embodiment, a center region R1 formed only from the n-type semiconductor layer 42 and a peripheral region R2 formed from the n-type semiconductor layer 42 and the low refractive-index semiconductor film L1A are formed. The peripheral region R2 has a smaller optical distance between the first and second reflectors 41 and 34 than that in the center region R1. Accordingly, as in the other embodiments, the surface emitting laser 40 having a low threshold and a high output can be provided.

Fifth Embodiment

Figure 7:
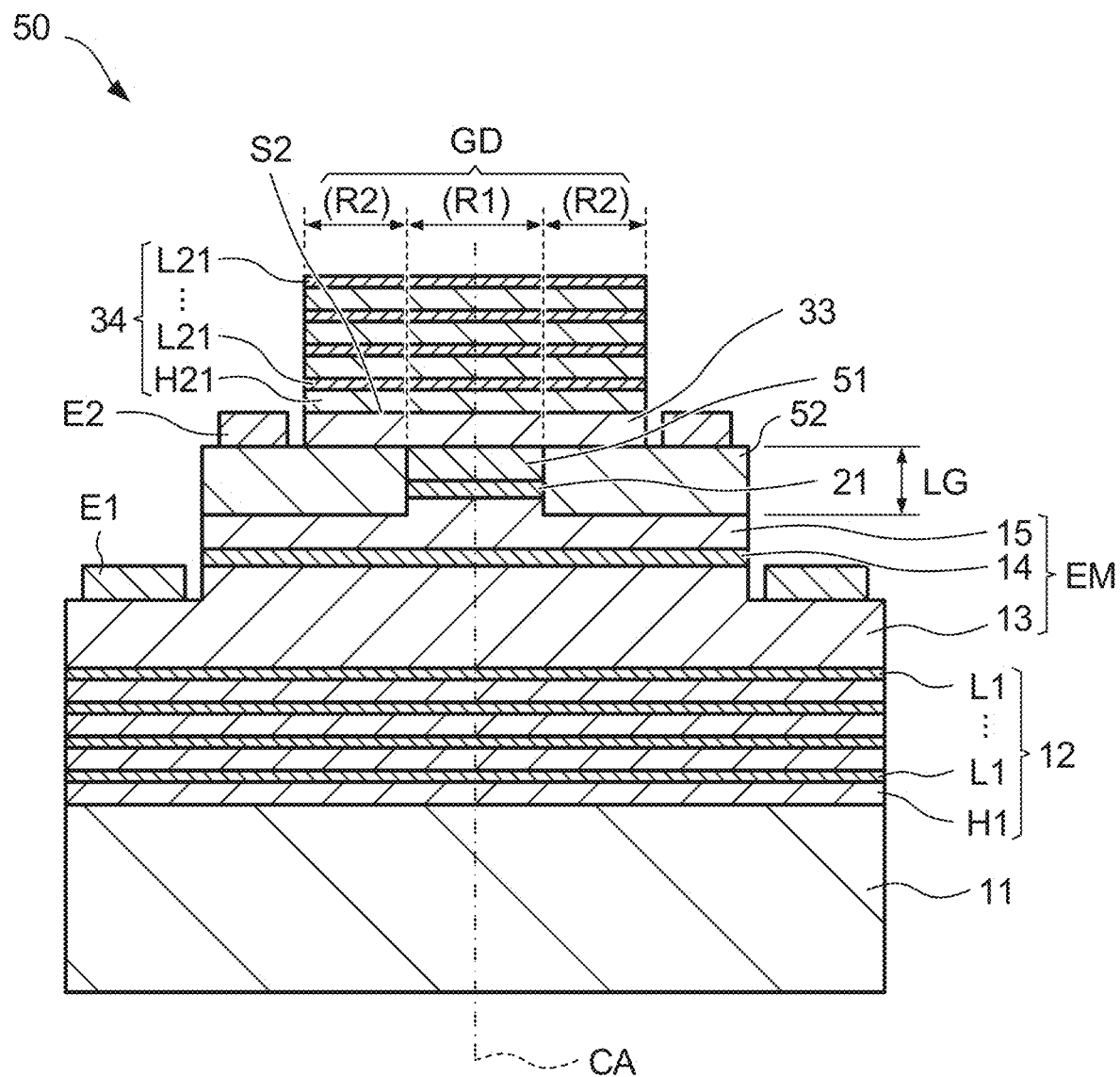
FIG. 7 is a cross-sectional view of a surface emitting laser according to a fifth embodiment.

FIG. 7 is a cross-sectional view of a surface emitting laser 50 according to a fifth embodiment. The surface emitting laser 50 has the same configuration as that of the surface emitting laser 30 except for the light guide structure LG. In the present embodiment, the light guide layer LG is composed only of the semiconductor layer.

The surface emitting laser 50 has a tunnel junction layer 21 provided on a partial region on the p-type semiconductor layer 15 of the semiconductor structure layer EM. The tunnel junction layer 21 has the same configuration as that of the tunnel junction layer 21 in the surface emitting laser 20. The tunnel junction layer 21 defines a center region R1 in the first and second reflectors 12 and 34.

The surface emitting laser 50 includes an n-type semiconductor layer (second n-type semiconductor layer or third semiconductor layer) 51 provided on the tunnel junction layer 21, and an n-type semiconductor layer (third n-type semiconductor layer or fourth semiconductor layer) 52 surrounding the side surface of the n-type semiconductor layer 51 and having a smaller refractive index than that of the n-type semiconductor layer 51. The n-type semiconductor layer 52 defines a peripheral region R2 in the first and second reflectors 12 and 34. In the present embodiment, the n-type semiconductor layer 51, the tunnel junction layer 21, a part of the p-type semiconductor layer 15, and the n-type semiconductor layer 52 constitute the light guide layer LG.

The n-type semiconductor layer 52 contains Ge as an n-type impurity. As a result, the n-type semiconductor layer 52 has a smaller refractive index than the average refractive index of the n-type semiconductor layer 51, the tunnel junction layer 21, and a portion of the p-type semiconductor layer 15 (i.e., the center region R1). The n-type semiconductor layer 52 has an upper surface that is flush with the upper surface of the n-type semiconductor layer 51. That is, the n-type semiconductor layer 52 is formed around the n-type semiconductor layer 51 (i.e., in the peripheral region R2), so as to flatten the upper surface of the light guide layer LG. Accordingly, the light guide layer LG has a flat upper surface.

On the n-type semiconductor layers 51 and 52, an insulating layer 33 and a second reflector 34 are formed as a spacer layer. Since the light guide layer LG has a flat upper surface, each of the insulating layer 33 and the second reflector 34 has a flatness property over the center region R1 and the peripheral region R2. Accordingly, it is possible to provide the surface emitting laser 50 with a low threshold and a high output.

The embodiments described above are merely an example. For example, the various embodiments described above may be combined with each ether. For example, the surface emitting laser 10 may have the light guide structure GD of the surface emitting laser 40. Further, the surface emitting laser 40 may have a current confinement structure by the tunnel junction layer 21.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, is should be appreciated that the present invention is not limited to the disclosed Examples but may be practiced within the full scope of the appended claims.

This application is based upon and claims the benefit of priority from the prior Japanese Patent Applications No. 2018-099677 filed on May 24, 2018 and No. 2018-238075 filed on Dec. 20, 2018, the entire contents of which are incorporated herein by reference.

What is claimed is:

1. A vertical cavity light-emitting element comprising:
   a substrate;
   a first multilayer reflector formed on said substrate;
   a semiconductor structure layer formed on said first multilayer reflector and including a light emitting layer;
   a second multilayer reflector formed on said semiconductor structure layer and constituting a resonator together with said first multilayer reflector; and
   a light guide layer which forms a light guide structure including a center region extending in a direction perpendicular to the upper surface of said substrate between said first and second multilayer reflectors and including a light emission center of said light-emitting layer, and a peripheral region provided around said center region and having a smaller optical distance between said first and second multilayer reflectors than that in said center region,
   wherein:
   said second multilayer reflector has a flatness property over said center region and said peripheral region,
   the light guide layer has an equivalent refractive index higher in the center region than in the peripheral region, and
   said light guide layer includes:
   a first translucent insulating layer provided between said semiconductor structure layer and said second multilayer reflector, said first translucent insulating layer having a convex portion in said center region; and a second translucent insulating layer formed on said first translucent insulating layer in said peripheral region, said second translucent insulating layer having an upper surface which forms a flat upper surface of said light guide layer along with an upper surface of said convex portion and having a smaller refractive index than said first translucent insulating layer.

2. The vertical cavity light-emitting element according to claim 1, further comprising a current confinement layer provided between said first and second multilayer reflectors to confine a current path in said semiconductor structure layer and define said light emission center of said light-emitting layer, wherein:

said current confinement layer has an opening having a diameter of 5.5 μm or less to form a current confinement portion which defines said current path, and a distance between said first and second reflectors in said center region is four times or more a wavelength of light emitted from said light-emitting layer in a medium in said center region.

3. The vertical cavity light-emitting element according to claim 1, further comprising a current confinement layer that confines a current path in said semiconductor structure layer and defines said light emission center of said light-emitting layer, wherein said current confinement layer has a tunnel junction layer.

4. The vertical cavity light-emitting element according to claim 1, wherein said substrate has a composition of GaN.

5. The vertical cavity light-emitting element according to claim 1, further comprising a current confinement layer provided between said first and second multilayer reflectors to confine a current path in said semiconductor structure layer and define said light emission center of said light-emitting layer, wherein said current confinement layer has an opening to form a current confinement portion which defines said current path, and said current confinement portion has an elliptical columnar shape.

6. The vertical cavity light-emitting element according to claim 1, wherein when an equivalent refractive index of said center region R1 is referred to as a refractive index n1 and an equivalent refractive index of said peripheral region is referred to as a refractive index n2, a relative refractive index difference $\Delta n$ of said refractive indices n1 and n2 satisfies a relation of $\Delta n = (n1-n2)/n1 \geq 1.0 \ast 10^{-2}$.

* * * * *